United States Patent
Patil et al.

(10) Patent No.: US 8,878,120 B2
(45) Date of Patent: Nov. 4, 2014

(54) ACTIVE BANDGAP TUNING OF GRAPHENE FOR TUNABLE PHOTODETECTION APPLICATIONS

(75) Inventors: Vikram Arvind Patil, Hoboken, NJ (US); Eui-Hyeok Yang, Fort Lee, NJ (US); Stefan Strauf, Ridgewood, NJ (US)

(73) Assignee: The Trustees of the Stevens Institute of Technology, Hoboken, NJ (US)

( * ) Notice: Subject to any disclaimer, the term of this patent is extended or adjusted under 35 U.S.C. 154(b) by 348 days.

(21) Appl. No.: 13/324,622

(22) Filed: Dec. 13, 2011

(65) Prior Publication Data

US 2012/0153119 A1 Jun. 21, 2012

Related U.S. Application Data

(60) Provisional application No. 61/422,399, filed on Dec. 13, 2010.

(51) Int. Cl.
| | |
|---|---|
| *H01L 31/00* | (2006.01) |
| *B82Y 30/00* | (2011.01) |
| *B82Y 40/00* | (2011.01) |
| *H01L 31/028* | (2006.01) |
| *H01L 31/09* | (2006.01) |

(52) U.S. Cl.
CPC ............... *B82Y 30/00* (2013.01); *B82Y 40/00* (2013.01); *H01L 31/028* (2013.01); *H01L 31/09* (2013.01); *Y02E 10/547* (2013.01)
USPC ...................................... 250/214.1

(58) Field of Classification Search
USPC .......................... 250/214.1, 214 R
See application file for complete search history.

(56) References Cited

U.S. PATENT DOCUMENTS

| | | | |
|---|---|---|---|
| 4,772,924 A | 9/1988 | Bean et al. | |
| 4,903,101 A | 2/1990 | Maserjian | |
| 5,238,868 A | 8/1993 | Elman et al. | |
| 6,813,064 B2 | 11/2004 | John et al. | |
| 7,217,951 B2 | 5/2007 | Krishna et al. | |
| 7,387,253 B1 | 6/2008 | Parker et al. | |
| 7,550,755 B2 | 6/2009 | Balkenende et al. | |
| 7,628,928 B2 | 12/2009 | Guerra | |
| 7,830,926 B1 | 11/2010 | Kim | |
| 2003/0012249 A1 | 1/2003 | Eisenbeiser | |
| 2007/0215855 A1 | 9/2007 | Kang | |
| 2010/0207254 A1* | 8/2010 | Jain et al. ................. | 257/629 |
| 2010/0290217 A1* | 11/2010 | Anantram et al. ............ | 362/159 |
| 2011/0101309 A1 | 5/2011 | Lin et al. | |

OTHER PUBLICATIONS

Jacoby, Mitch, "Graphene Moves Toward Applications", Chemical & Engineering News, vol. 89, No. 47, Nov. 21, 2011, pp. 10, 12-15.

* cited by examiner

*Primary Examiner* — Thanh Luu
(74) *Attorney, Agent, or Firm* — Greenberg Traurig, LLP

(57) ABSTRACT

In a method for adjusting the sensitivity of a photodetector, the bandgap of the photodetection material is adjusted by inducing strain in the photodetection material. Such adjustments can be made in situ and continuously, in a reproducible and repeatable manner. In embodiments of the method, the photodetection material is graphene, carbon nanotubes or graphene nanoribbon. The use of graphene permits a dynamically-adjustable sensitivity over a dynamic range of radiation having wavelengths of 1.38 microns or less, up to at least 60 microns. In an adjustable photodetector, a graphene layer is suspended over a silicon substrate by a layer of an insulating material. Adjusting the voltage across the graphene layer and the silicon substrate induces strain in the graphene layer by electrostatic attraction.

6 Claims, 8 Drawing Sheets

ACTIVE BANDGAP TUNING OF GRAPHENE FOR TUNABLE PHOTODETECTION APPLICATIONS

CROSS-REFERENCE TO RELATED APPLICATIONS

This application claims the benefit of U.S. Provisional Patent Application No. 61/422,399 filed on Dec. 13, 2011, which is incorporated by reference herein in its entirety.

STATEMENT REGARDING FEDERALLY SPONSORED RESEARCH

Not applicable.

FIELD OF THE INVENTION

The present invention relates to photoelectronic devices, and more particularly to bandwidth tuning of photodetectors.

BACKGROUND OF THE INVENTION

Photodetectors comprise layers of photosensitive materials that can detect incident light of certain photon energies (which may also be expressed as wavelengths) related to the bandgap of the material. A bandgap is defined as the gap, expressed as an energy, between the lowest point of the conduction band and the highest point of the valence band of the material's electron energy dispersion relation (E-k) diagram, an example of which is shown as FIG. 1. Absorption of photons having at least the bandgap energy excites electrons from the valence band energy to the conduction band energy, thereby producing a photocurrent which can then be measured.

In existing photodetector technology, various materials having different bandgaps are used to detect different spectral ranges of incident electromagnetic radiation. However, the bandgaps, and thus the detectable range of photon energies, are fixed for the materials that are used in the device. This presents a profound limitation of the usefulness of the photodetector device.

SUMMARY OF THE INVENTION

In a method according to the present invention, the sensitivity of a photodetector is adjusted by inducing strain in the photodetection material, thereby altering its bandgap. In embodiments of the invention, the photodetection material may be graphene layers, carbon nanotubes or graphene nanoribbons. The use of graphene as a photodetection material permits a dynamically adjustable sensitivity to incident photons. In an embodiment of the method, strain is induced in the graphene layer by an electrostatic actuator.

In a photodetector according to the present invention, a photodetection material is suspended over an electrically-conductive substrate by a layer of insulating material. An opening in the insulating layer exposes the graphene to the substrate. A voltage is applied across the graphene layer and the substrate. Adjusting the voltage varies the strain induced in the graphene layer, changing the bandgap of the graphene and, thus, the sensitivity of the photodetector to photons of different energies.

BRIEF DESCRIPTION OF THE DRAWINGS

For a better understanding of the present invention, reference is made to the following detailed description of an exemplary embodiment considered in conjunction with the accompanying drawings, in which.

DETAILED DESCRIPTION OF THE INVENTION

The present invention provides methods and devices for active in-situ tuning of the bandgap of a photodetector device by inducing strain in the photodetection material. It has particular applicability to materials such as graphene, carbon nanotubes (CNT) or graphene nanoribbons (GNR), but may also be applied to other photodetection materials having electron valence bands that may be altered by inducing strain in the material. The spectral sensitivity of a photodetector that uses such materials can be continuously modulated to detect a wide range of photon energies or wavelengths (λ) of the incident light while the device is in operation. The modulation method is hereinafter referred to as "active bandgap tuning" (ABT). Strain induction in graphene, CNT, GNR or other materials can be achieved actively using conventional MEMS actuation techniques, including and not limited to electrostatic actuation, pneumatic actuation or thermal actuation.

Figure 1:
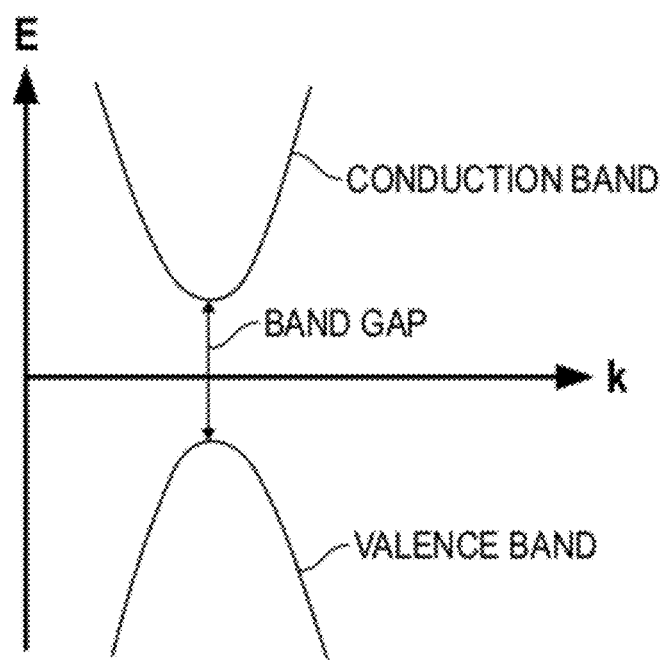
FIG. 1 is an exemplary electron energy dispersion relation (E-k) diagram.
Figure 2A:
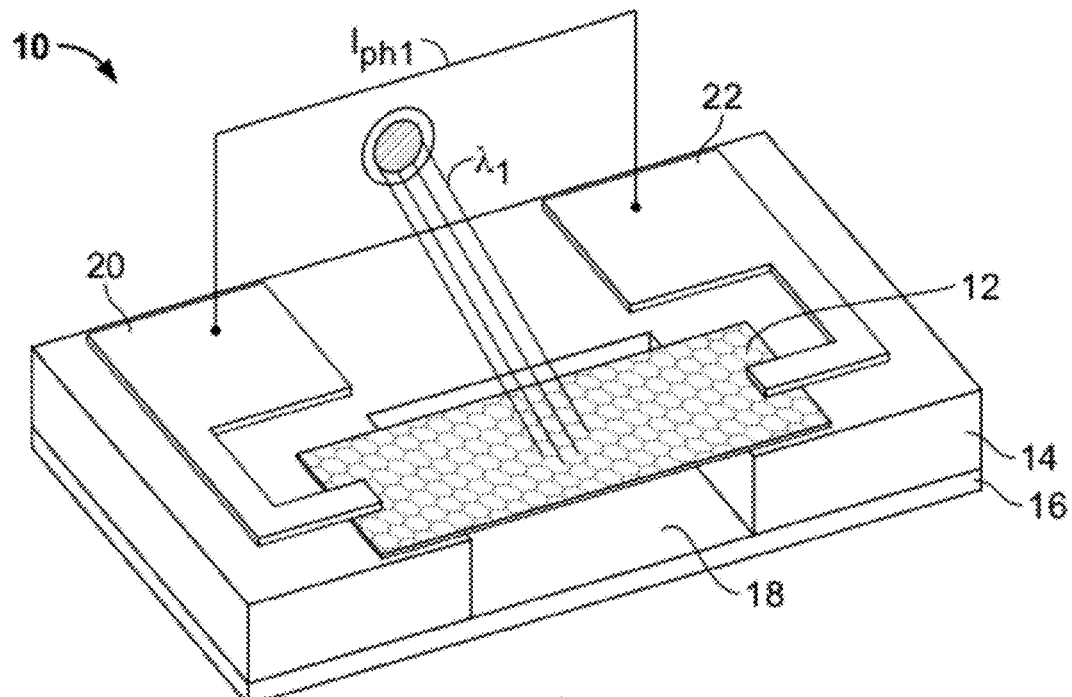
FIG. 2A is a schematic diagram of an adjustable bandgap-tunable photodetector according to an embodiment of the present invention, with an unstrained layer of graphene as the photodetection material.
Figure 3A:
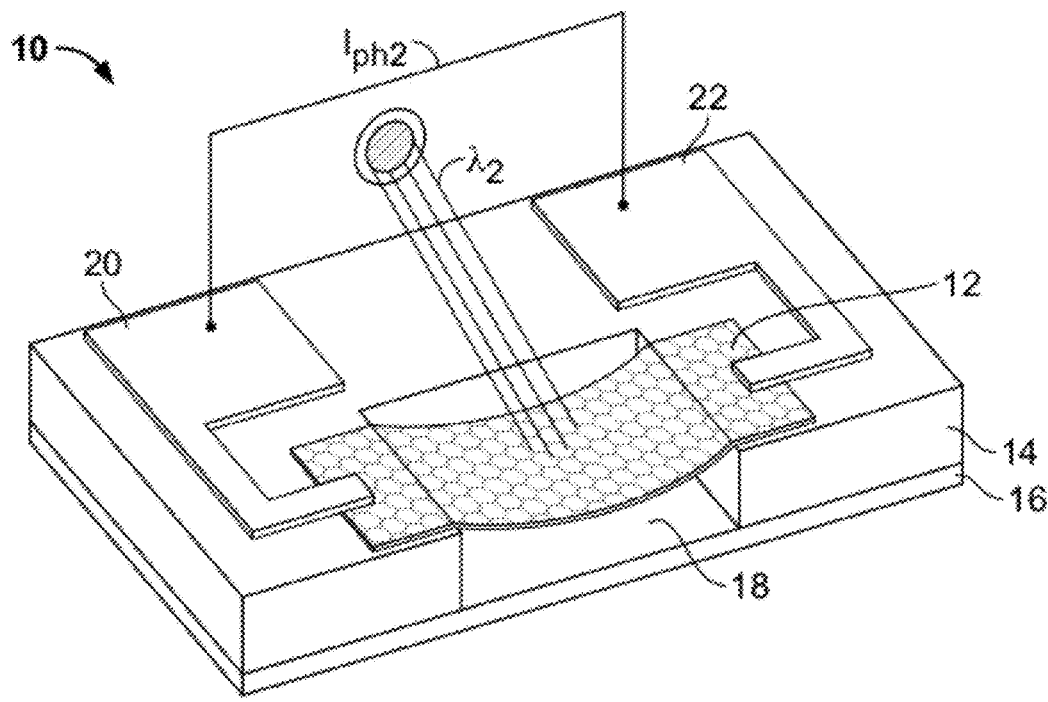
FIG. 3A is a schematic diagram of the photodetector of FIG. 2A wherein the graphene layer is strained.
Figure 4A:
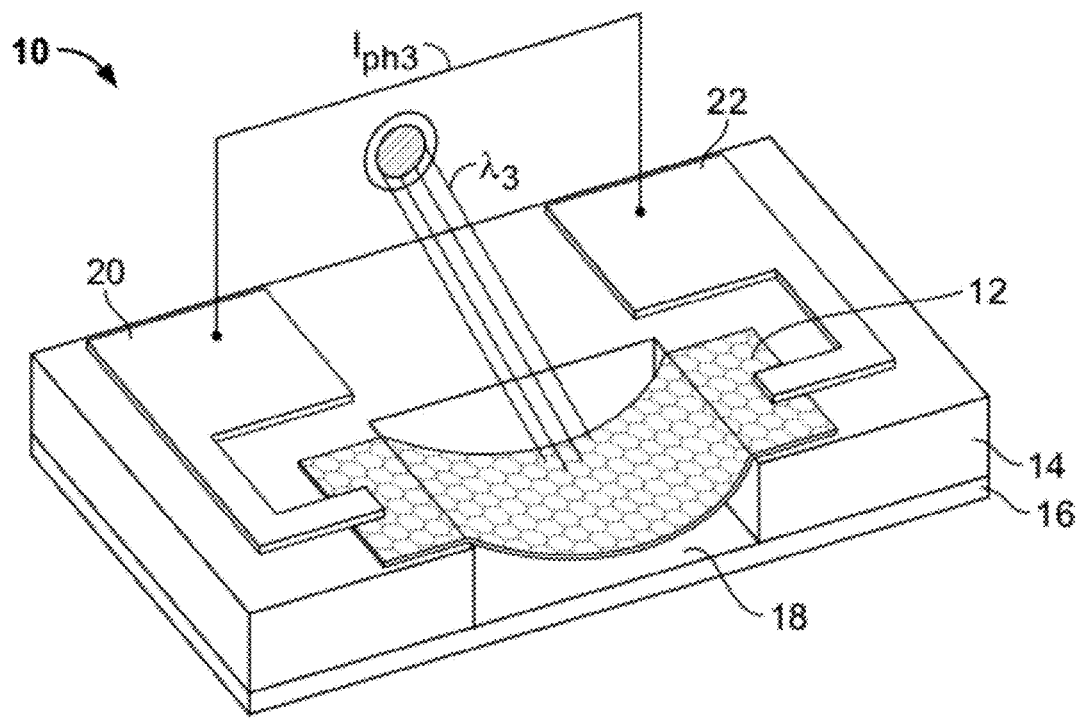
FIG. 4A is a schematic diagram of the photodetector of FIG. 2A wherein the graphene layer is strained to a greater degree than is represented in FIG. 3A.

The ABT technique can be advantageously used with graphene as the photodetection material, as discussed hereinbelow with regard to the exemplary embodiments. FIGS. 2A, 3A and 4A show a schematic representation of an electrostatically-actuated graphene-based ABT photodetector 10 with different sized bandgaps. The photodetector 10 includes a graphene layer 12 supported on an electrically-insulated material, such as silicon oxide layer 14 on an electrically-conductive substrate, such as silicon substrate 16. The graphene layer 12 is suspended over a trench 18 in the silicon oxide layer 14. A source electrode 20 and a drain electrode 22 are in electrical contact with the graphene layer 12. Strain is applied electrostatically to the graphene layer 12 by applying an actuation voltage ($V_{ACT}$) (not shown) across the silicon substrate 16 and the drain electrode 22. A source-drain voltage ($V_{SD}$) (not shown) is applied across the source and drain electrodes 20, 22.

Figure 2B:
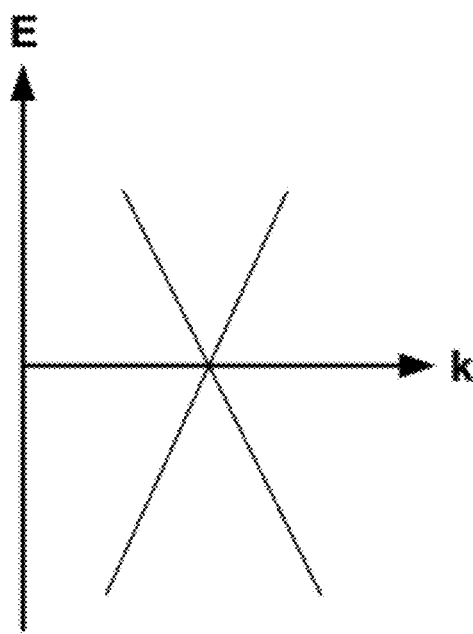
FIG. 2B is an exemplary E-k diagram for the graphene layer of FIG. 2A.
Figure 3B:
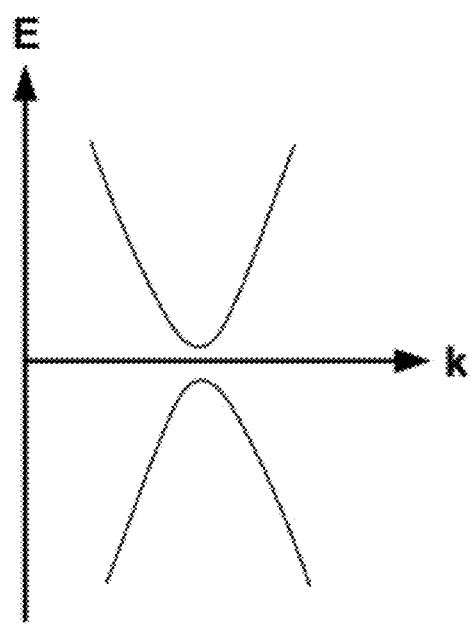
FIG. 3B is an exemplary E-k diagram for the graphene layer of FIG. 3A.
Figure 4B:
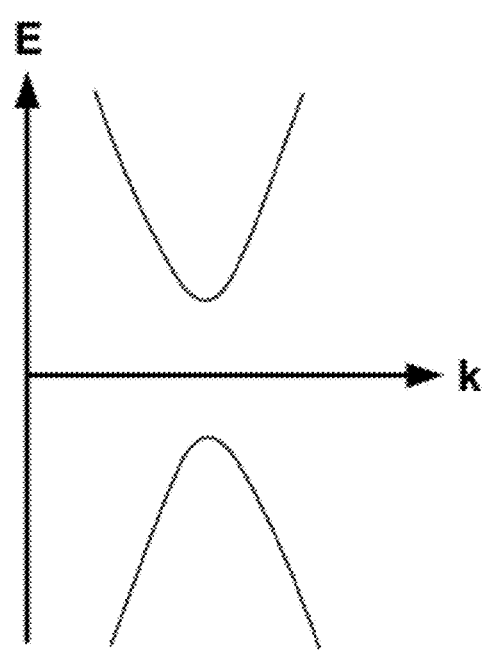
FIG. 4B is an exemplary E-k diagram for the graphene layer of FIG. 4A.

FIGS. 2B, 3B and 4B are electron energy dispersion relation (E-k) diagrams related to FIGS. 2A, 3A and 4A, respectively. In its unstrained state (FIGS. 2A and 2B), graphene exhibits a "zero" bandgap energy band structure at room temperature (i.e., at roughly 300 K), and generates a photocurrent $I_{ph1}$ at any wavelength $\lambda_1$ of incident light. As $V_{ACT}$ is increased, the graphene layer 12 is strained and the bandgap opens (FIGS. 3A and 3B). A photocurrent $I_{ph2}$ is generated at a wavelength $\lambda_2$ having an energy that is equal to or greater than the bandgap energy of the strained graphene layer 12. As $V_{ACT}$ is further increased, the graphene layer 12 is further strained and the bandgap opens more, such that incident light at a wavelength $\lambda_3$, having an energy that is greater than that of wavelength $\lambda_2$, is needed to generate a photocurrent $I_{ph3}$ (FIGS. 4A and 4B).

Figure 5:
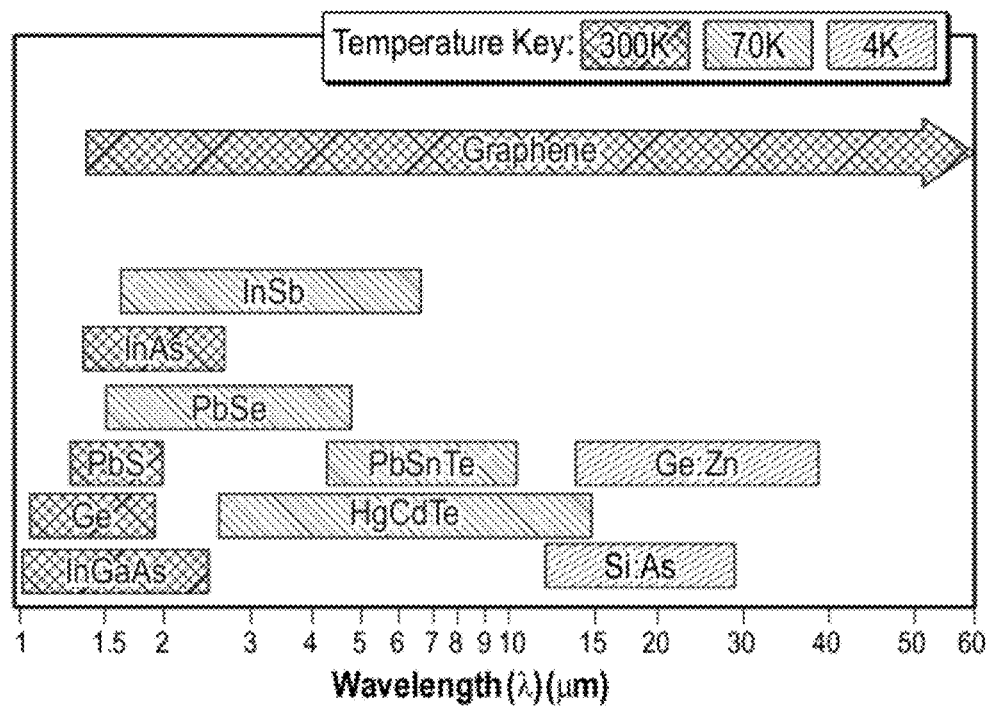
FIG. 5 is a graph showing the spectral ranges of conventional photodetection materials and the spectral range of graphene.

Upon induction of strain, the bandgap of graphene can be opened up to at least 0.9 eV, although larger bandgaps are theoretically possible. Graphene also exhibits photodetection capability in the infrared ("IR") spectral range. Thus, the ABT technique combines bandgap tunability of graphene from 0 to at least 0.9 eV ($\lambda \approx 1.38$ µm) with its photodetection capabilities to detect IR wavelengths from less than 1.38 µm to a high upper limit as the bandgap approaches "zero." However, 14 µm may be the practical upper limit considering the limitations of the IR transmission band of atmosphere at sea level. Further, a graphene-based ABT photodetector would be operable at common environmental temperatures and at cryogenic temperatures. FIG. 5 is a graph comparing the theoretical spectral range of graphene at 300 K with the spectral ranges and operating temperatures of conventional photodetection materials (e.g., Ge, InGaAs, InSb, CdTe, HgCdTe, PbS and PbSe).

The exemplary embodiment of a graphene-based ABT photodetector 10 is electrostatically actuated. By controlling $V_{ACT}$, the amount of strain and bandgap opening in the graphene layer 12 can be precisely controlled, thereby controlling the photoresponse of the photodetector 10. Strain induction in materials such as graphene, CNT or GNR can also be precisely implemented by other well-established MEMS technology, such as pneumatic, piezoelectric or magnetic actuation, or by various mechanical structures such as, but not limited to, membrane, cantilever and/or fixed beam structures. The induction of strain in the graphene layer is repeatable and reproducible.

In an embodiment of the present invention, an ABT photodetector of the same general type of photodetector 10, may be prepared as illustrated sequentially in FIGS. 6-10 and described hereinbelow. This exemplary method uses a graphene layer as a photodetection material. The method may be readily adapted by those having ordinary skill in the relevant arts to use CNT or GNR, or other available photodetection materials whose bandgaps may be controlled by inducing strain in the materials. Suitable photodetection materials are presently available from commercial sources.

Figure 6:
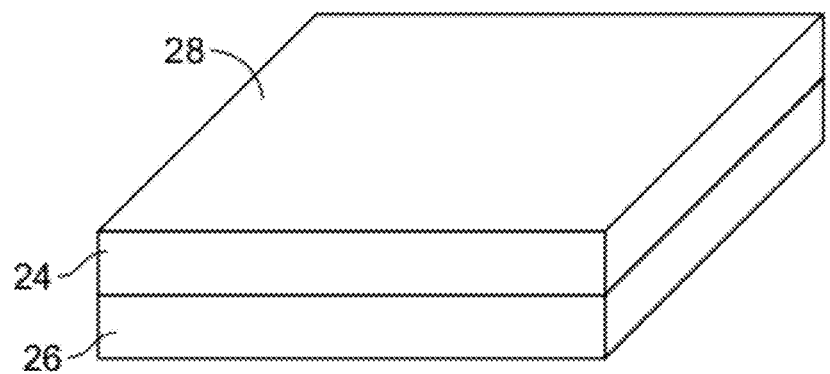
FIGS. 6-10 are schematic diagrams illustrating a sequence of steps in fabricating an adjustable bandgap-tunable photodetector of the same general type as the photodetector of FIG. 2A.

Referring to FIG. 6, a silicon oxide layer 24 is formed on a silicon substrate 26 using any of a number of well-known methods. A suitable thickness for the silicon oxide layer is 300 nm. The exposed surface 28 of the silicon oxide layer 24 is then cleaned, for example, by sequentially washing it with acetone, isopropyl alcohol (IPA), and de-ionized (DI) water.

Figure 7:
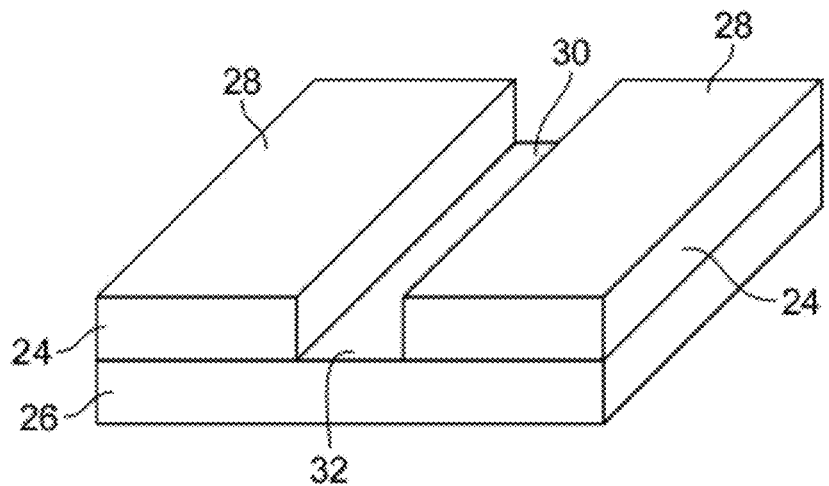

Referring to FIG. 7, a trench 30 is etched into the silicon oxide layer 24 so as to expose a surface 32 of the silicon substrate 26. In some embodiments, it may be preferred to etch a hole pattern rather than a trench. Etching may be performed using photoresist methods.

Figure 8:
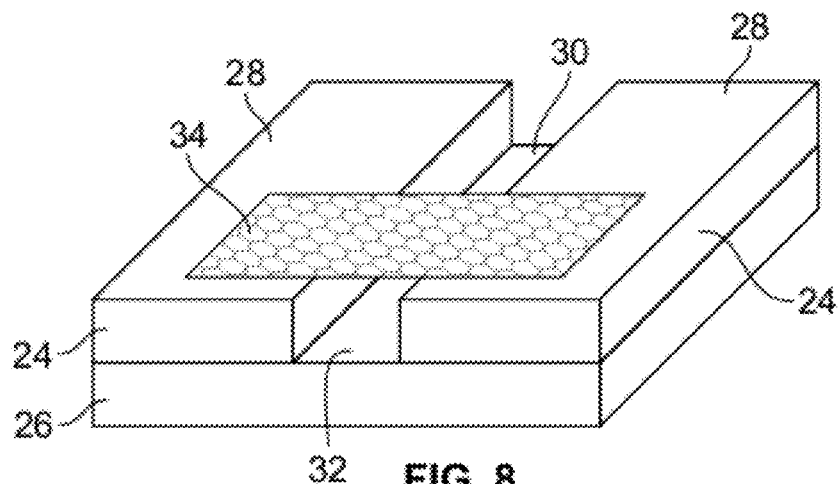

Referring to FIG. 8, a graphene layer 34 is transferred onto the surface 28 of the silicon oxide layer 24 such that it is suspended over the trench 30 and away from the exposed surface 32 of the silicon substrate 26.

Figure 9:
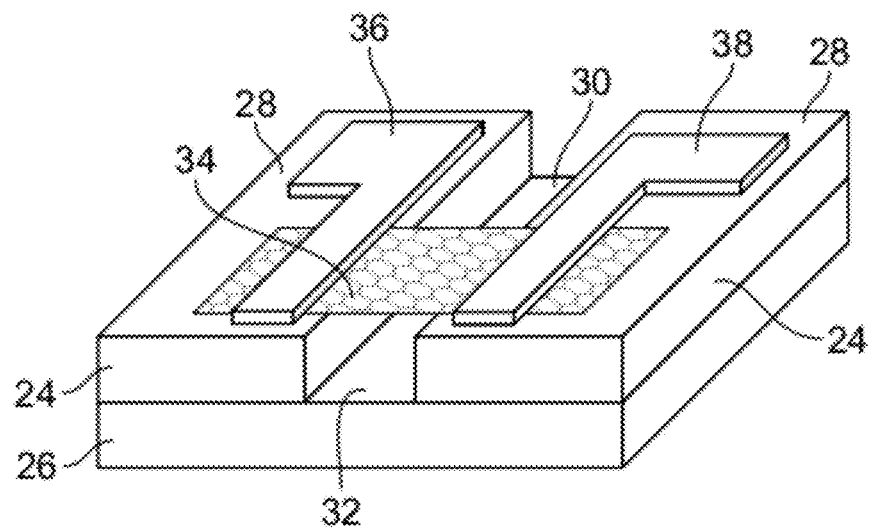

Referring to FIG. 9, electrodes 36, 38 are defined on the graphene layer 34 to collect photo-excited carriers during the operation of the photodetector. In operation, one electrode 36 will serve as a source electrode 36 and the other electrode 38 will serve as a drain electrode 38. Methods of defining metal electrodes, such as photoresist masking and e-beam evaporation, are well-known, but the range of suitable electrodes need not be limited to those types.

Figure 10:
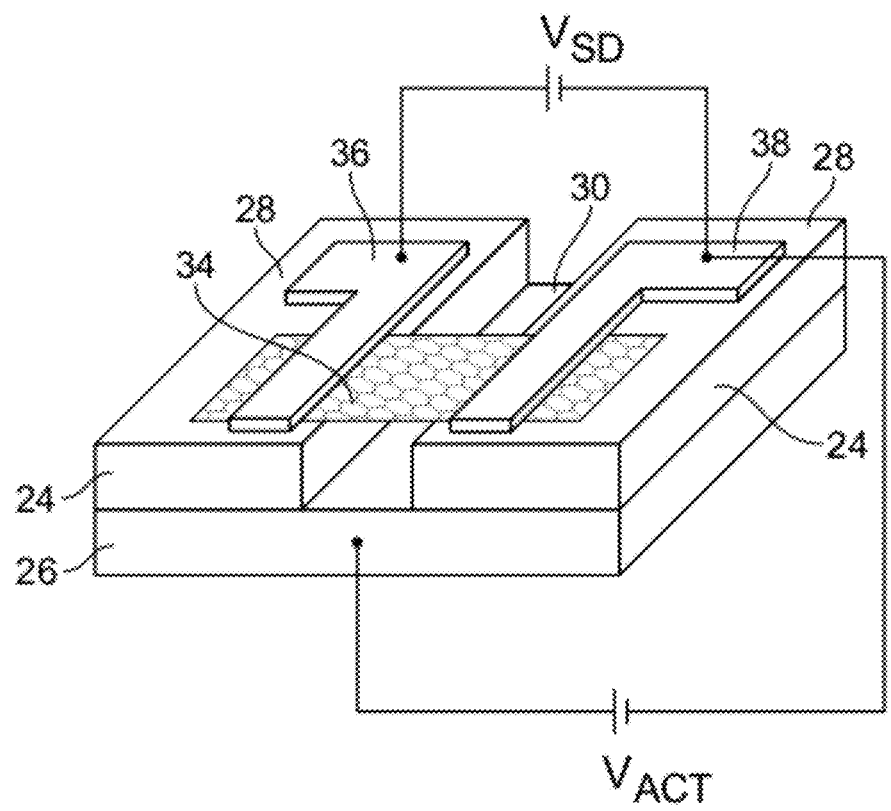

Referring to FIG. 10, an electrical voltage $V_{SD}$ is connected across the source and drain electrodes 36, 38 to create a circuit with the photodetection material (e.g., graphene layer 34). An actuation voltage $V_{ACT}$ is connected across the drain electrode 38 and the silicon substrate 26.

Figure 12:
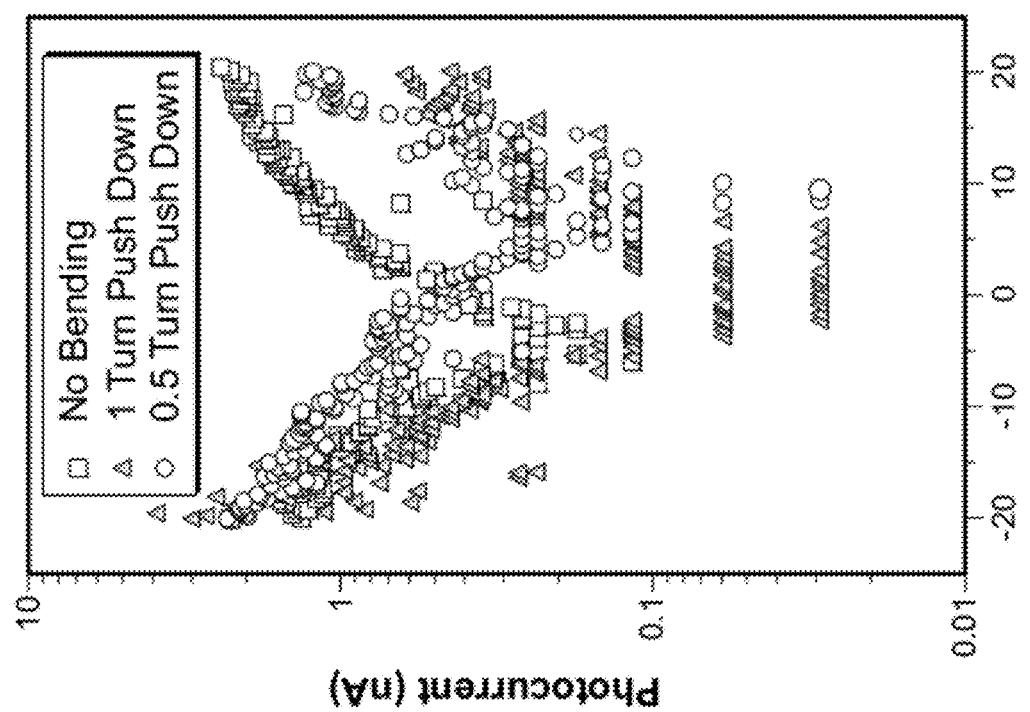
FIG. 12 is a plot of photocurrents generated by the photodetection circuit of FIG. 11 under three different degrees of induced strain.
Figure 11:
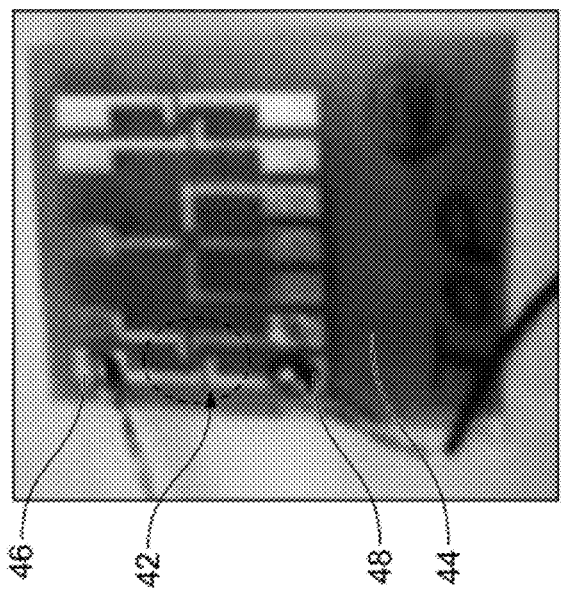
FIG. 11 is a photograph of a photodetection circuit prepared according to the principles of the present invention.

In a proof-of-concept experiment, a photodetection circuit 40, seen in FIG. 11, was prepared by transferring a graphene layer 42 onto a flexible polyimide (DuPont™ Kapton®) substrate 44, and metal electrodes 46, 48 were defined on the graphene layer 42 and substrate 44. The graphene layer 42 is not visible in FIG. 11 because of its natural transparency, but its location is indicated by the reference arrow. The circuit 40 was then mounted on a stage (not shown) and fixed in position with an active area of the graphene layer 42 at the edge of the circuit 40 that was over the stage, and a portion of the circuit 40 opposite the active area of the graphene layer 42 extending off of the stage in a cantilevered fashion. A precise micro Z-stage with a probe needle was positioned in contact with the cantilevered portion of the circuit 40. The height of the Z-stage was adjusted precisely by turns of its screw to move the cantilevered portion of the circuit 40 up or down, thus flexing the circuit and inducing strain on the graphene layer 42. The circuit was then electrically connected to a Keithley® source meter (Keithly Instruments, Inc., Cleveland, Ohio) and lock-in amplifier across the electrodes 46, 48 to measure photocurrent. The graphene layer 42 was then irradiated with radiation having a wavelength of 532 nm from a green laser, while the height of the Z-stage was adjusted step-wise to move the cantilevered portion of the circuit 40 downward, flexing the circuit 40. The photocurrent generated by the circuit was measured at each step as the source voltage was varied. FIG. 12 is a plot of the measured photocurrents against voltage for each of three degrees of flexion. It can be seen that the photocurrent/voltage relationships are different for each degree of flexion. This demonstrates that the photoelectric response of the graphene layer 42 to incident light of a fixed frequency changes as the strain on the graphene layer 42 is varied. The decrease in photocurrent at higher degrees of strain is believed to be caused by an increase in the bandgap of the graphene layer 42, since fewer charge carriers would be excited from the valence band to the conduction band.

ABT photodetectors have numerous potential applications. Several examples of such applications are summarized hereinbelow.

Tunable IR Imaging:

Currently-available IR imaging technologies provide IR sensing in a mid-wave window (about 1 to 5 µm) (MWIR) by using photodetection materials such as PbS and PbSe, and in a long-wave window (about 10 to 12 µm) (LWIR) using mercury cadmium telluride (MCT). Thus, there is still a range of IR greater than 12 µm which cannot be sensed readily using current technology. The use of graphene-based ABT photodetectors can extend the range of detectable wavelengths beyond 12 µm up to the far IR range. Although, as discussed above, there may be a practical upper limit of 14 µm because of the transmission band of atmosphere at sea level, imaging applications may be realized outside of the atmosphere. This extended ability for IR imaging can be used in immediate applications such as, but not limited to, deep space exploration, satellite imaging and surveillance, etc.

Tunable Phototransistors for Data Storage:

ABT photodetectors can be used to adjust the characteristics of phototransistors by tuning the sensitivity of the phototransistor to a certain incident wavelength. It can be used in optical data storage or optical data reading devices. Thus, the ABT technique can be used in novel future applications related to tunable phototransistors.

Optical Wheatstone Bridge:

An optical Wheatstone bridge with tunable photosensitive arms can be utilized not only for selective imaging, but also to perform selective signal detection. In an exemplary application of an optical Wheatstone bridge, one arm of the bridge includes a photodetector having a fixed spectral range and the opposite arm includes an ABT photodetector that is continuously adjusted to analyze the spectrum of a light source.

Tunable Solar Energy Harvesting Devices:

Using the ABT technique, a photoactive layer of graphene can be made sensitive to a desired wavelength of light, such as wavelengths in the IR range. This creates an opportunity to harvest energy from a wider spectrum of solar or other environmental radiation than is harvested using currently-available photocells. The ABT photocell can be tuned to take advantage of the energy spectra that are available under various environmental conditions (e.g., sunny skies vs. overcast skies; or changes from natural to artificial light).

It will be understood that the embodiments described herein are merely exemplary and that a person skilled in the art may make many variations and modifications without departing from the spirit and scope of the invention. All such variations and modifications are intended to be included within the scope of the invention as defined in the appended claims.

We claim:

1. A method of adjusting the sensitivity of a photodetector to photons having a photon energy, comprising the steps of: (i) providing said photodetector with a photodetection material having an electron energy bandgap that is alterable by inducing strain in the photodetection material; (ii) providing an electrically-conductive substrate having a layer of an electrically-insulating material thereupon, the layer of electrically-insulating material defining an opening through which a portion of the electrically-conductive substrate is exposed, wherein the photodetection material is supported by the electrically-insulating material so as to expose the photodetection material to the exposed portion of the electrically-conductive substrate; (iii) providing an adjustable voltage source that is electrically connected to the electrically-conductive substrate and the photodetection material; and (iv) adjusting the voltage source so as to induce strain in the photodetection material to thereby alter said electron energy bandgap of said photodetection material to an electron energy bandgap equal to or lower than said photon energy, wherein said photodetection material is selected from the group consisting of graphene layers, carbon nanotubes, and graphene nanoribbons.

2. The method of claim 1, wherein the electrically-conductive substrate is a silicon substrate and the electrically-insulating material is silicon oxide.

3. The method of claim 1, wherein the means for inducing strain in the photodetection material induces such strain using a device selected from the group consisting of an electrostatic device, a pneumatic device, a magnetic device and a mechanical device.

4. A photodetector having an adjustable sensitivity to photons having a photon energy, comprising a photodetection material selected from the group consisting of graphene layers, carbon nanotubes, and graphene nanoribbons, and means for inducing strain in said photodetection material in a reversible and reproducible manner, wherein said means for inducing strain in said photodetection material includes an electrically-conductive substrate, a layer of an electrically-insulating material that is on said electrically-conductive substrate and defines an opening through which a portion of said electrically-conductive substrate is exposed and an adjustable voltage source, and wherein said photodetection material is supported by said electrically-insulating material so as to expose said photodetection material to said exposed portion of said electrically-conductive substrate, and said adjustable voltage source is electrically connected to said electrically-conductive substrate and said photodetection material.

5. The photodetector of claim 4, wherein said electrically-conductive substrate is a silicon substrate and said electrically-insulating material is silicon oxide.

6. The photodetector of claim 4, wherein said means for inducing strain in said photodetection material induces such strain using a device selected from the group consisting of an electrostatic device, a pneumatic device, a magnetic device and a mechanical device.

* * * * *